(12) United States Patent
De La Cruz et al.

(10) Patent No.: US 7,378,879 B1
(45) Date of Patent: May 27, 2008

(54) DECODING SYSTEMS AND METHODS

(75) Inventors: Louis De La Cruz, Pflugerville, TX (US); Hemanshu T. Vernenker, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 136 days.

(21) Appl. No.: 11/157,349

(22) Filed: Jun. 20, 2005

(51) Int. Cl.
*H03K 19/094* (2006.01)

(52) U.S. Cl. ................................ 326/105; 326/108
(58) Field of Classification Search ......... 326/105–108
See application file for complete search history.

(56) References Cited

U.S. PATENT DOCUMENTS

| | | | | |
|---|---|---|---|---|
| 5,130,704 | A | * | 7/1992 | Ogawa et al. ............... 345/204 |
| 5,327,022 | A | * | 7/1994 | Yamada et al. ................ 326/21 |
| 5,701,094 | A | * | 12/1997 | Sridhar et al. ............... 326/113 |
| 6,351,152 | B1 | * | 2/2002 | Reddy et al. ................ 326/105 |
| 6,834,004 | B2 | * | 12/2004 | Takano et al. ................ 365/51 |
| 6,956,399 | B1 | * | 10/2005 | Bauer ........................... 326/41 |

OTHER PUBLICATIONS

Rhyne, Fundamental of Digital Systems Design, N.J. 1973, pp. 70-71.*

\* cited by examiner

*Primary Examiner*—James H Cho

(57) ABSTRACT

Systems and methods are disclosed herein for decoder applications. For example, in accordance with an embodiment of the present invention, an integrated circuit includes a decoder that receives a plurality of input signals and partially decodes the input signals based on their true and complement values to provide a plurality of decoded signals. The decoded signals, for example, may be utilized to control a multiplexer.

3 Claims, 6 Drawing Sheets

DECODING SYSTEMS AND METHODS

TECHNICAL FIELD

The present invention relates generally to electrical circuits and, more particularly, to decoding schemes, such as for example for configuration memory.

BACKGROUND

Programmable logic devices (PLDs), such as field programmable gate arrays, programmable interconnect devices, and complex programmable logic devices, are utilized in a wide variety of applications. In general, PLDs and other types of configurable or programmable devices typically employ configuration memory cells, which can be programmed or otherwise store the information that determines the functions or operation of the device. The configuration memory cells may include static random access memory (SRAM) cells (also referred to as SRAM bits), fuses, anti-fuses, or other types of volatile or nonvolatile configuration memory, including one-time programmable devices.

One drawback of certain types of configuration memory cells (e.g., configuration SRAM bits) is their susceptibility to soft errors. Consequently, it would be advantageous to decrease the number of configuration memory cells to decrease the likelihood of a soft error event. For some types of configuration memory cells (e.g., SRAM), an additional advantage that may be obtained by decreasing the number of configuration memory cells is a reduction in the leakage current onto the configuration memory data lines.

For example, multiplexers associated with one or more logic blocks within a PLD may be configured as a number ("N") of M:1 multiplexers feeding an N:1 multiplexer. This architecture may be configured with N+M SRAM cells, which is a greater number of configuration memory cells than would be required if they were fully decoded (e.g., $\log_2(M*N)$ configuration memory cells). If the minimum number of configuration memory cells were fully decoded for a large multiplexer, such as for example a 36:1 multiplexer, this would require decoding six bits to provide thirty-six output signals. This approach may have a number of drawbacks, such as requiring multiple stages of decoder logic and a relatively large area to implement the circuitry.

An alternative approach would be to decode fully the minimum number of configuration memory cells (e.g., SRAM bits) required for each multiplexer stage. For example, if a 36:1 multiplexer was implemented by using seven 6:1 multiplexers, then two sets of three SRAM bits would each need to be decoded to provide six output signals (e.g., by employing three input AND gates (NAND followed by an inverter) or three input NOR gates). However, as with the prior approach, a prohibitive amount of die area may be required to implement the circuitry. As a result, there is a need for improved decoding techniques, such as for configuration memory applications or other decoder applications.

SUMMARY

In accordance with one embodiment of the present invention, an integrated circuit includes a decoder adapted to receive a plurality of input signals, wherein the decoder comprises a number of logic gates adapted to partially decode the input signals based on true and complement values of the input signals to provide a plurality of decoded signals; and a multiplexer adapted to receive a plurality of multiplexer input signals and the plurality of decoded signals and provide a multiplexer output signal, wherein the plurality of decoded signals determines which one of the multiplexer input signals to provide as the multiplexer output signal.

In accordance with another embodiment of the present invention, an integrated circuit includes a logic gate having a first, a second, and a third transistor, wherein the first transistor, having a first gate, a first drain, and a first source, is adapted to receive at the first gate a first one of the input signals; the second transistor, having a second gate, a second drain, and a second source, with the second drain coupled to the first drain, is adapted to receive at the second gate a first one of the input signals and receive at the second source a second one of the input signals; and the third transistor, having a third gate, a third drain, and a third source, with the third drain coupled to the first and second drains and the third source coupled to the first source, is adapted to receive at the third gate a complement value of the second one of the input signals received at the second source, wherein one of the decoded signals is provided at the third drain.

In accordance with another embodiment of the present invention, an integrated circuit includes means for receiving input signals; and means for partially decoding the input signals to provide decoded signals, wherein the decoding means provides the decoded signals based on corresponding subsets of the input signals.

In accordance with another embodiment of the present invention, a method of decoding input signals includes receiving the input signals; and partially decoding subsets of the input signals to provide decoded output signals.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1A:
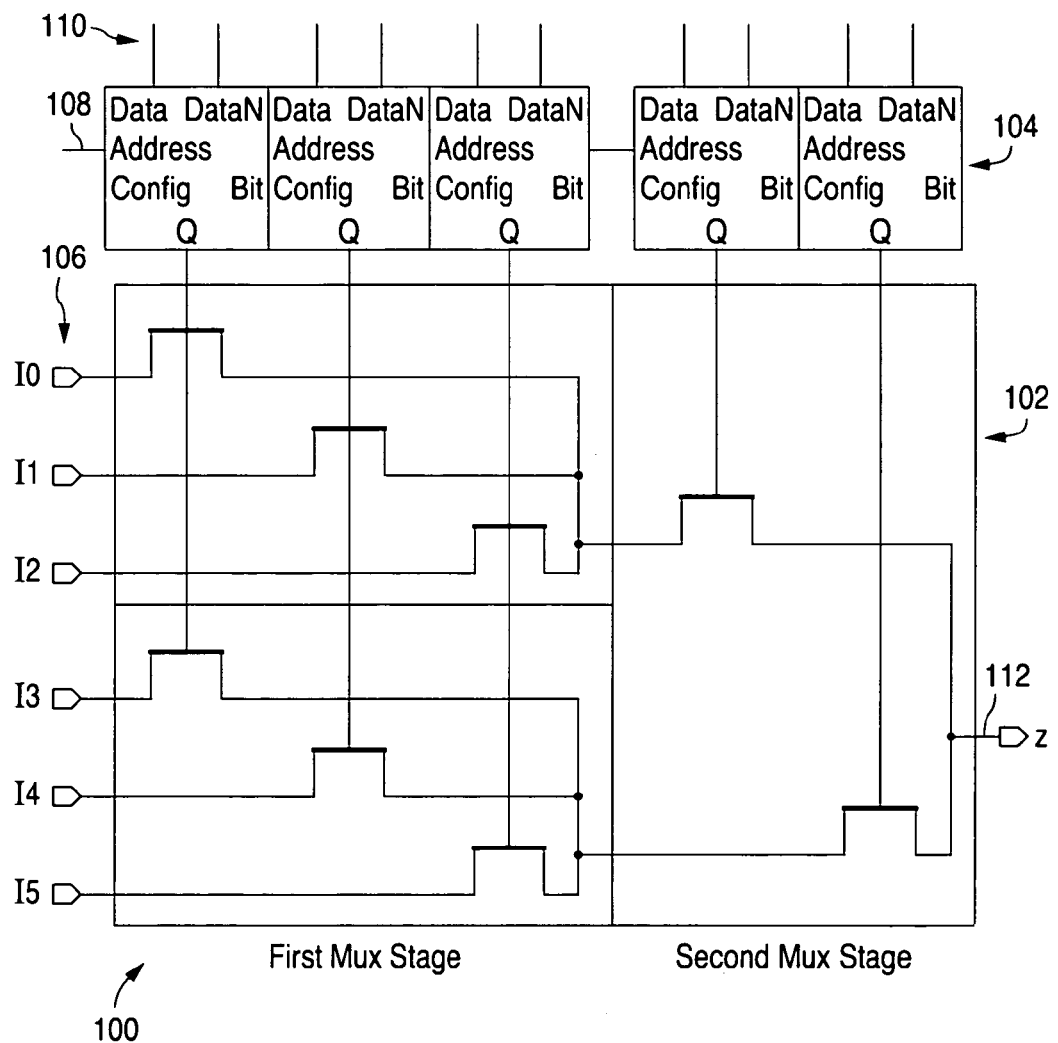
FIGS. 1a and 1b show block diagrams illustrating conventional multiplexers with associated circuitry.

FIG. 1a shows a block diagram of a circuit 100, which illustrates a conventional multiplexer 102 controlled by configuration memory 104. Configuration memory 104 receives address signals 108 and data signals 110 for programming configuration memory 104. Multiplexer 102 receives input signals 106 and provides one of input signals 106 as an output signal 112, as determined by the data stored by configuration memory 104. Configuration memory 104 may represent, for example, SRAM cells, fuses, anti-fuses, or other types of configuration memory (volatile or non-volatile), including one-time programmable devices.

Multiplexer 102 may be implemented as one or more multiplexer stages, such as exemplified in FIG. 1a, with multiplexer 102 having a first multiplexer stage and a second multiplexer stage. The first multiplexer stage may include a number ("N") of M:1 multiplexers (e.g., two 3:1 multiplexers as shown in FIG. 1a), whose output signals are provided to the second multiplexer stage that includes an N:1 multiplexer (e.g., one 2:1 multiplexer as shown in FIG. 1a).

The first and second multiplexer stages result in an overall ((N)(M)):1 multiplexer (e.g., a 6:1 multiplexer as shown in FIG. 1a). The multiplexers in the first and second multiplexer stages, for example in FIG. 1a, may include "M" and "N" pass transistors, respectively, and are provided with "M" and "N" control signals, respectively, to their gates, with the pass transistors having their drains connected.

For this exemplary implementation for circuit 100, configuration memory 104 includes (M+N) configuration bits (e.g., 5 configuration bits as shown in FIG. 1a) to select, via multiplexer 102, which one of input signals 106 to provide as output signal 112. An alternative conventional approach, which generally reduces the number of configuration bits of configuration memory 104 required to store the data for configuring multiplexer 102, utilizes $\log_2(M)$ and $\log_2(N)$ configuration bits of configuration memory 104 and a decoder circuit to control the pass transistors within multiplexer 102.

Figure 1B:
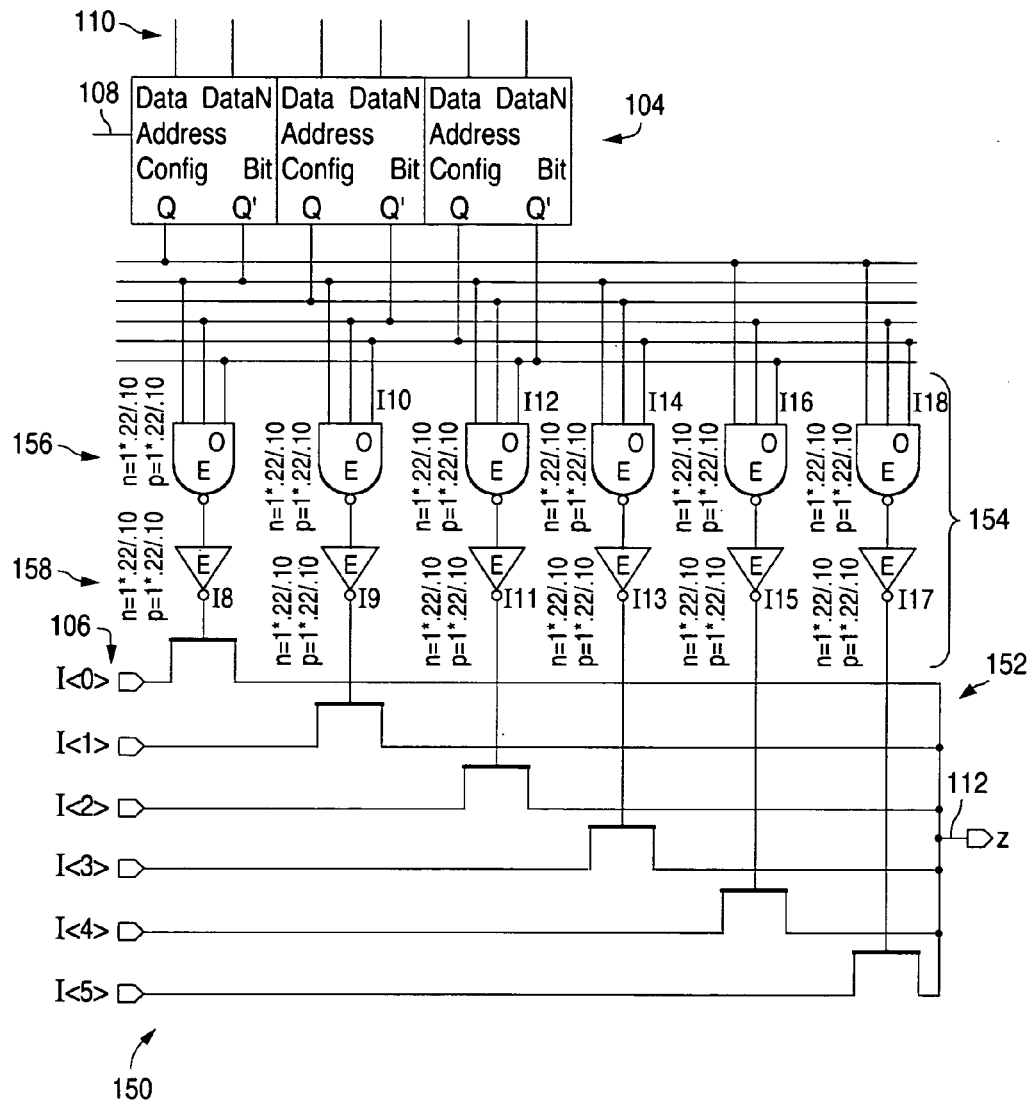

Thus, this alternative approach would only require three configuration bits in configuration memory 104 rather than the five configuration bits in configuration memory 104 as discussed above. For example, FIG. 1b shows a block diagram of a circuit 150, which illustrates a conventional multiplexer 152 controlled by configuration memory 104 via a decoder 154.

For this example, configuration memory 104 has three configuration bits, which provide signals that are decoded by decoder 154 having six three input logic gates 156 (i.e., NAND gates) followed by inverters 158. However, one drawback for this alternative approach, for example, is that 4:1 multiplexers or larger require a decoder with decoder elements having three or more input terminals (such as shown for decoder 154 for the 6:1 multiplexer 152 of FIG. 1b), which require a significant amount of die area to implement.

In contrast, in accordance with one or more embodiments of the present invention, techniques are disclosed to partially decode input signals to determine decoded output states. The number of decoded output states may be less than the possible number of output states based on the number of input signals. However, the decoding architecture may be implemented with fewer decoder elements and/or each decoder element may receive fewer input signals than would generally be required relative to some conventional approaches. Thus, for example, by utilizing the partial decoding techniques disclosed herein, a subset of the input signals may be utilized to provide each decoded output state, with fewer input terminals on each decoder element than the number of input signals.

For example, by utilizing the techniques disclosed herein, a 6:1 multiplexer may be implemented that requires only three configuration bits and six two input decoder elements within a decoder. If conventional techniques were employed, for example, fully decoding the three configuration bits may require eight three input decoder elements within a decoder. However, by utilizing techniques disclosed herein, the configuration bits are only partially decoded and the number of decoder elements is reduced from eight to six within a decoder, with the number of input signals to each of the decoder elements reduced from three to two for the 6:1 multiplexer example.

Although a 6:1 multiplexer is described, it should be understood that the 6:1 multiplexer is a representative example and that the techniques disclosed herein may be applied to other multiplexer sizes that are smaller or larger than the 6:1 multiplexer (e.g., 2:1, 3:1, 4:1, 5:1, 7:1, 8:1, up to 36:1 or larger), depending upon the application or requirements. The multiplexer may be a single stage multiplexer or a multiple stage multiplexer, with the techniques disclosed herein not limited to any particular type of multiplexer. Furthermore, the techniques disclosed herein may be applied to other types of circuitry, besides multiplexers, and to applications generally that require signal decoding.

For example, Table 1 illustrates a truth table for signals D, E, and F. As shown in Table 1, there are only two states, states 110 and 111, in which signals D and E (also referred to herein as bits, such as bits D and E) are both high. Furthermore, there are only two states, states 101 and 111, in which signals D and F are both high, while there are only two states, states 011 and 111, in which signals E and F are both high.

TABLE 1

| D | E | F |
|---|---|---|
| 0 | 0 | 0 |
| 0 | 0 | 1 |
| 0 | 1 | 0 |
| 0 | 1 | 1 |
| 1 | 0 | 0 |
| 1 | 0 | 1 |
| 1 | 1 | 0 |
| 1 | 1 | 1 |

By not allowing the state 111, the three unique states DE, DF, and EF may each be decoded with a two input AND gate. Furthermore, by not allowing the state 000, the three unique states D'E', D'F', and E'F' may each be decoded by a two input AND gate. This is illustrated in the truth table shown in Table 2 for signals D, E, and F.

TABLE 2

| D | E | F | Output  | Decode |
|---|---|---|---------|--------|
| 0 | 0 | 0 | Illegal |        |
| 0 | 0 | 1 | State 0 | D'E'   |
| 0 | 1 | 0 | State 1 | D'F'   |
| 0 | 1 | 1 | State 2 | EF     |
| 1 | 0 | 0 | State 3 | E'F'   |
| 1 | 0 | 1 | State 4 | DF     |
| 1 | 1 | 0 | State 5 | DE     |
| 1 | 1 | 1 | Illegal |        |

As an example, in accordance with an embodiment of the present invention, if the true and complement of each signal (e.g., each signal D, E, and F) are available, the entire 3:6 decoder may be implemented with six two input AND gates.

For example, each SRAM bit of the configuration memory may provide the true and complement of each signal as would be understood by one skilled in the art.

Furthermore, for example in accordance with an embodiment of the present invention, to eliminate contention between multiplexer input signals (e.g., upon startup or power up when all of the signals are low), one of the signals may be inverted (e.g., the signals from one of the SRAM bits providing true and complement signals may be inverted or switched). For example, Table 3 illustrates a truth table for signals D, E, and F, where signal D is inverted and state 100 (i.e., state 3) is the startup state.

TABLE 3

| D' | E | F | Output | Decode |
|---|---|---|---|---|
| 1 | 0 | 0 | State 3 | E'F' |
| 1 | 0 | 1 | State 4 | D'F |
| 1 | 1 | 0 | State 5 | D'E |
| 1 | 1 | 1 | Illegal | |
| 0 | 0 | 0 | Illegal | |
| 0 | 0 | 1 | State 0 | DE' |
| 0 | 1 | 0 | State 1 | DF' |
| 0 | 1 | 1 | State 2 | EF |

Figure 2:
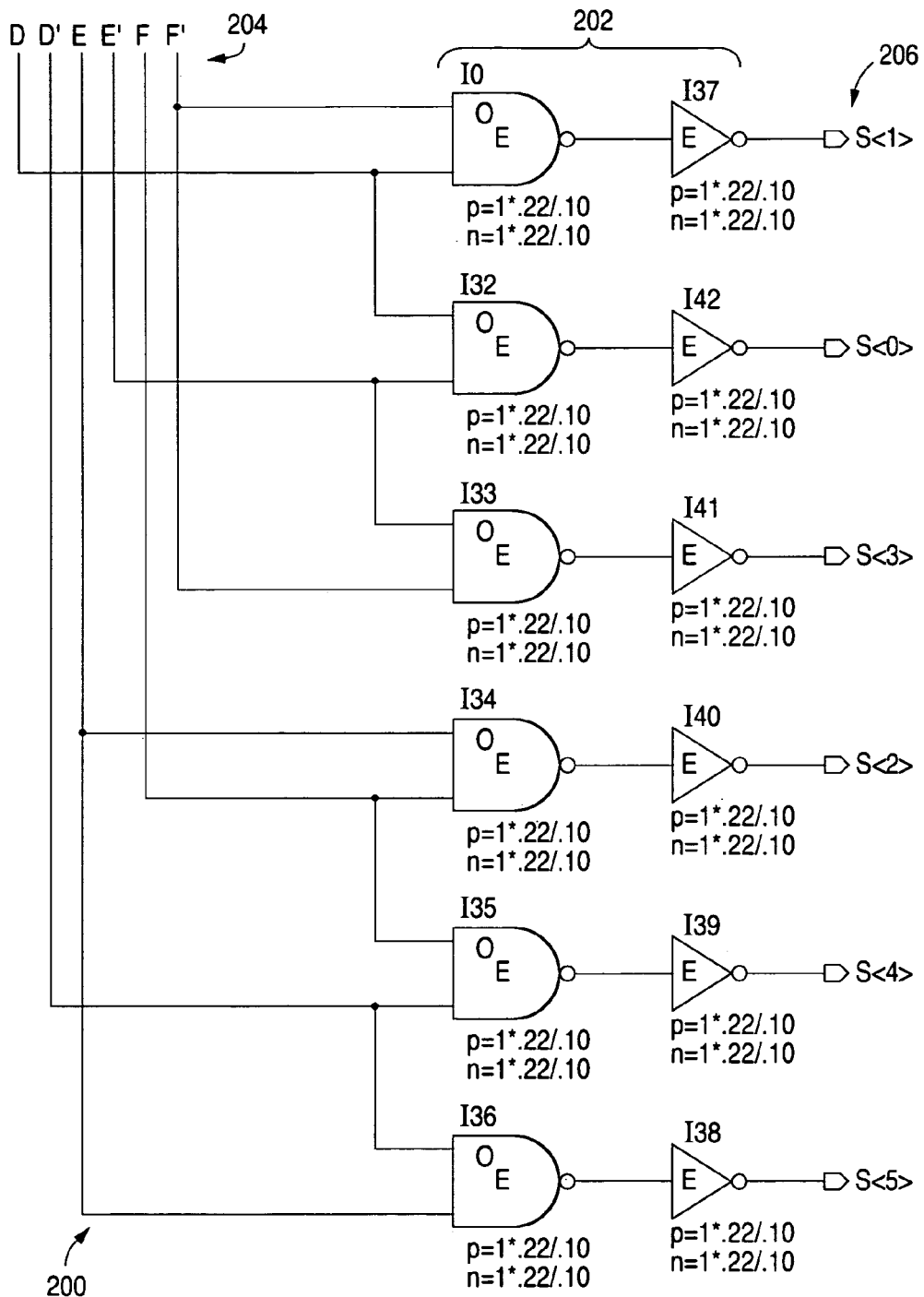
FIG. 2 shows a block diagram illustrating a decoder in accordance with an embodiment of the present invention.

The decoder for the truth table in Table 3, in accordance with an embodiment of the present invention, may be implemented with six two input NAND gates with inverted outputs. For example, FIG. 2 shows a block diagram of a decoder 200 in accordance with an embodiment of the present invention. Decoder 200 includes logic gates 202 (i.e., six two input NAND gates and six corresponding inverters), which selectively receive signals 204 (true and complement signals D, E, and F) from three bits of configuration memory 104 and provide output signals 206.

Thus, for example, decoder 200 may replace decoder 154 within circuit 150 (FIG. 1b) to control multiplexer 152 based on data stored in configuration memory 104. Consequently, in accordance with one or more embodiments of the present invention, by utilizing the partial decoding techniques disclosed herein, decoder elements may be implemented with fewer input terminals than the number of input signals 204 (i.e., decoder elements decode based on subsets of signals 204). Furthermore, it should be understood that the techniques disclosed herein may be applied to any number of input signals.

One potential drawback of decoder 200 is that decoder 200 may require more die area to implement, for example, relative to the configuration memory cells that decoder 200 is replacing (e.g., two SRAM bits relative to FIG. 1a or three SRAM bits based on the six SRAM bits required to control directly multiplexer 152 of FIG. 1b). Therefore, in accordance with an embodiment of the present invention, a two input AND gate (also referred to herein as a three transistor (3T) two input AND gate) is disclosed that may reduce the amount of die area required to implement a decoder.

Figure 3:
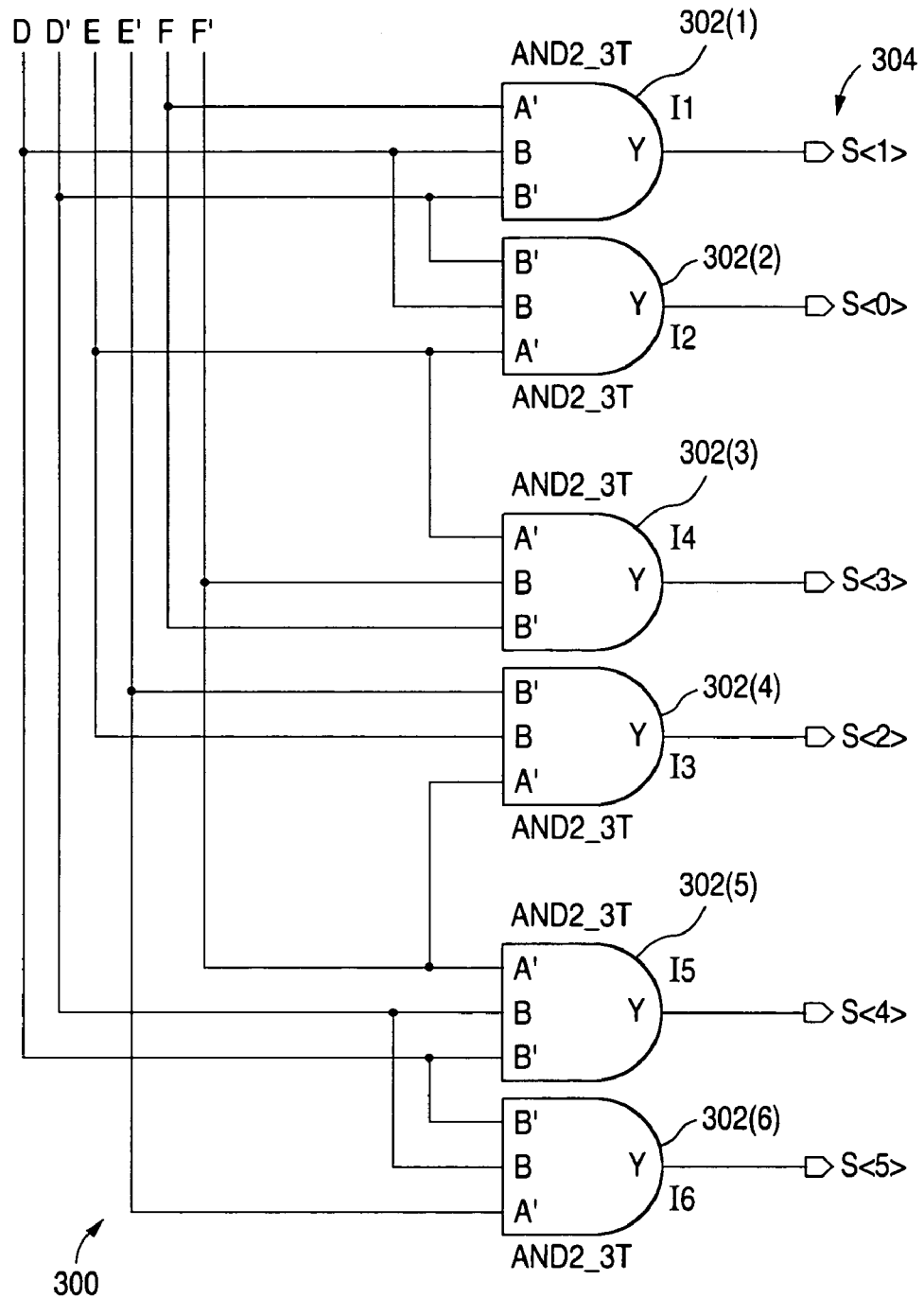
FIG. 3 shows a block diagram illustrating a decoder in accordance with an embodiment of the present invention.

For example, FIG. 3 shows a block diagram illustrating a decoder 300 in accordance with an embodiment of the present invention. Decoder 300 is an exemplary decoder for the 6:1 multiplexer example and includes six logic gates 302 (e.g., six two input AND gates, which are separately referenced as logic gates 302(1) through 302(6)). For example, decoder 300 may replace decoder 154 of FIG. 1b, with configuration memory 104 providing signals D, E, and F (true and complement).

Decoder 300 receives signals D, E, and F (true and complement signals) and provides output signals 304, which are labeled S<1>, S<0>, S<3>, S<2>, S<4>, and S<5> and provided from corresponding logic gates 302(1) through 302(6). Output signals 304 may be provided to the transistor gates of a multiplexer (e.g., multiplexer 152 of FIG. 1b). As illustrated in FIG. 3, there may be a significant amount of shared input signals between adjacent logic gates 302 (e.g., logic gate 302(1) and 302(2)), which may simplify the connections in a physical layout.

Signals D, E, and F may be provided by configuration memory cells. For example, signals D, E, and F may be provided by conventional SRAM bits, which provide both a true and a complement output signal (e.g., true and complement signals for D, E, and F). Therefore, no additional logic besides logic gates 302 for decoder 300 would be required (e.g., inverters are not required).

However, if signals D, E, and F that are provided to decoder 300 originated from other than configuration memory cells 104, inverters may be included (e.g., as part of decoder 300) to provide the complement signals. For example, in accordance with an embodiment of the present invention, rather than configuration memory cells providing the signals to the decoder, the signals may be provided from other circuitry, internal or external to the integrated circuit that incorporates decoder 300. Therefore, the techniques disclosed herein are applicable not only to programmable logic devices, but to any type of integrated circuit (programmable or not programmable) that requires configuration of multiplexers and/or the decoding of signals.

Thus, the techniques disclosed herein may be applied, for example, where it is desired to provide a limited number of signals and/or have a decoder requiring minimal die area relative to some conventional approaches. For example, rather than configuration memory cells, the signals may be provided by circuitry, where the number of signals provided is limited due to routing congestion or other factors.

Figure 4:
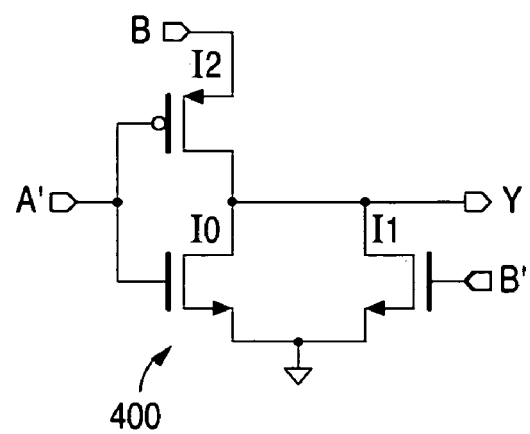
FIG. 4 shows a circuit diagram illustrating an exemplary implementation of a portion of the decoder of FIG. 3 in accordance with an embodiment of the present invention.

For the logic gates 302 of decoder 300, FIG. 4 shows a circuit 400, which illustrates an exemplary circuit implementation for one of logic gates 302 (e.g., logic gate 302(1)) in accordance with an embodiment of the present invention. Circuit 400, which is referred to herein as a 3T two input AND gate, receives two signals, signals A and B, and provides an output signal ("Y"). Signal A provides its complement signal and signal B provides its true and complement signals to circuit 400 as shown in FIG. 4. An exemplary truth table for circuit 400 is shown in Table 4.

TABLE 4

| A' | B | B' | Y |
|---|---|---|---|
| 1 | 0 | 1 | 0 |
| 1 | 1 | 0 | 0 |
| 0 | 0 | 1 | 0 |
| 0 | 1 | 0 | 1 |

Figure 5:
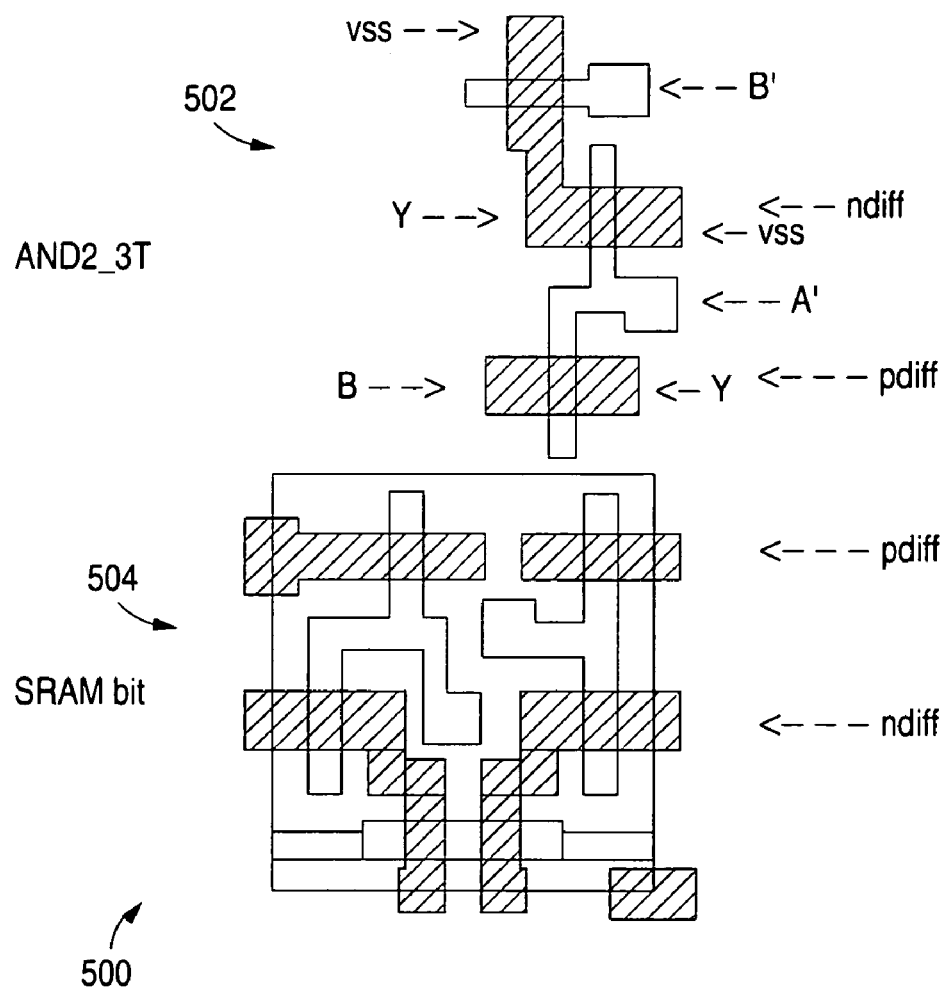
FIG. 5 shows a block diagram illustrating an exemplary physical layout in accordance with an embodiment of the present invention.

Logic gates 302, for example, may be positioned a short distance away (e.g., 6μ for 90 nm or approximately 4μ for 65 nm processing technology) from static nodes (e.g., transistor gates of multiplexer 152) that are being driven by logic gates 302. Therefore, if logic gates 302 were implemented, as shown in circuit 400 for example, the transistors of circuit 400 may be sized to similar dimensions as the transistors in the SRAM bits of the configuration memory (e.g., configuration memory 104). Consequently, as illustrated in FIG. 5 for an exemplary physical die layout 500 in accordance with an embodiment of the present invention, circuit 400 may be implemented (as represented by a section 502) to fit in approximately half of the area of an SRAM bit (as represented by a section 504) of configuration memory 104.

Figure 6:
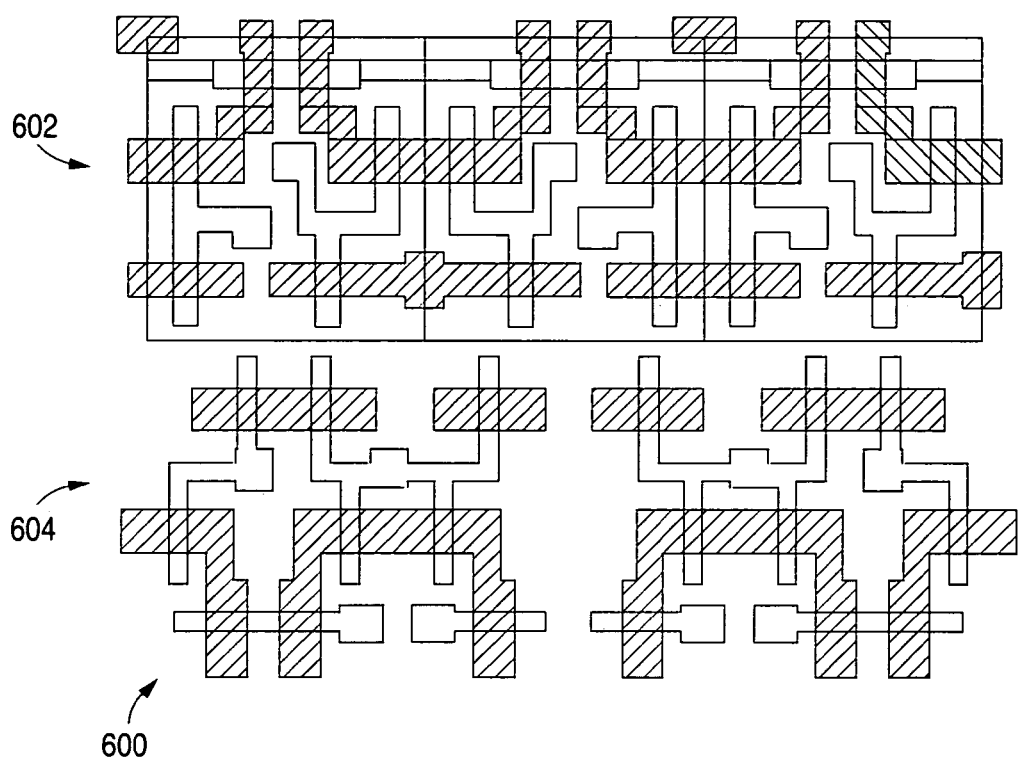
FIG. 6 shows a block diagram illustrating an exemplary physical layout in accordance with an embodiment of the present invention.

FIG. 6 shows a block diagram illustrating an exemplary physical die layout 600 for decoder 300 and three SRAM bits in accordance with an embodiment of the present invention. Specifically, layout 600 illustrates a section 602 representing decoder 300 (i.e., six logic gates 302 implemented with 3T two input AND gates) having an exemplary layout for shared connections for the decoder configuration. A section 604 represents an exemplary physical layout for three SRAM bits (e.g., for configuration memory 104). Thus, layout 600 represents an exemplary implementation of configuration memory 104 and decoder 300 for controlling a 6:1 multiplexer (e.g., multiplexer 152 of FIG. 1b).

It should be understood that the techniques disclosed herein, in accordance with one or more embodiments of the present invention, may be applied not only to a 3:6 decoder (e.g., decoder 300), but also to other types of decoders, such as for example a 2:3 decoder, a 2:4 decoder, or a 3:5 decoder. As an example, the techniques disclosed herein may be relatively die area neutral for 2:4 or 3:6 decoders if implemented with 3T AND gates (i.e., circuit 400).

For the 2:3 or 3:5 decoders implemented with 3T AND gates, additional die area may be required (e.g., the approximate die area of one-half of an SRAM bit) relative to some conventional techniques. However, depending upon the specific application and implementation, an entire row of SRAM bits may be eliminated, which results in less time to configure the PLD. Furthermore, by reducing the number of SRAM bits (or rows of SRAM bits), leakage onto the data lines may be reduced, which may allow the use of smaller and/or fewer buffers on the die.

Systems and methods are disclosed herein to provide decoder techniques, such as for example for configuration memory applications. For example, in accordance with an embodiment of the present invention, a decoder scheme is provided that utilizes less than the maximum number of configuration bits required along with a decoder architecture that requires fewer elements and less area for decoding the configuration bits as compared to some conventional techniques. For example, the decoder scheme may utilize a subset of the configuration bits to decode each unique output, thus decoder elements with fewer input terminals may be provided. Furthermore, an improved logic gate (referred to herein as a 3T two input AND gate) may be provided as a decoder element, which may require less area than a traditional decoder element.

In general, in accordance with one or more embodiments of the present invention, area efficient partial decoding schemes are provided, which may reduce the number of control signals or configuration bits. For example, in accordance with an embodiment of the present invention, the techniques may be applied to reduce the number of control signals provided to a decoder for various types of circuit applications. As another example, in accordance with an embodiment of the present invention, the techniques may be applied to reduce the number of configuration SRAM bits required to configure multiplexers associated with programmable logic blocks within a PLD. The techniques disclosed may provide certain advantages, such as for example a possible reduction in the relative number of soft errors, a reduction in the time required for configuration of the PLD, and/or a reduction in the leakage current on the configuration data lines.

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:

an X:Y decoder adapted to receive X input signals (e.g., D, E, and F) and provide Y decoded signals, wherein Y is less than $2^X$, the decoder including logic gates adapted to partially decode the X input signals based on true (e.g., D, E, and F) and complement (e.g., D', EF', and F') values of the input signals, wherein X is three and each such logic gate is adapted to receive fewer than X true values of the input signals and includes an AND gate adapted to receive one true value of an input signal and two complement values of input signals; and a multiplexer adapted to receive a plurality of multiplexer input signals and the Y decoded signals and provide a multiplexer output signal, wherein the Y decoded signals determine which one of the multiplexer input signals to provide as the multiplexer output signal.

2. A programmable logic device comprising:

configuration memory for storing true (e.g., D, E, and F) and complement (e.g., D', E', and F') values of X input signals (e.g., three);

an X:Y decoder adapted to receive the X input signals and provide Y decoded signals, wherein Y is less than $2^X$ (e.g., eight), the decoder including logic gates adapted to partially decode the X input signals based on the true and complement values of the input signals, wherein X is three and each such logic gate is adapted to receive fewer than X true values of the input signals and includes an AND gate adapted to receive one true value of an input signal and two complement values of input signals; and a multiplexer adapted to receive a plurality of multiplexer input signals and the Y decoded signals and provide a multiplexer output signal, wherein the Y decoded signals determine which one of the multiplexer input signals to provide as the multiplexer output signal.

3. An integrated circuit comprising:

an X:Y decoder adapted to receive X input signals (e.g., D, E, and F) and provide Y decoded signals, wherein Y is less than $2^X$, the decoder including logic gates adapted to partially decode the X input signals based on true (e.g., D, E, and F) and complement (e.g., D', E', and F') values of the input signals, wherein X is three and each such logic gate includes an AND gate adapted to receive one true value of an input signal and two complement values of input signals; and a multiplexer adapted to receive a plurality of multiplexer input signals and the Y decoded signals and provide a multiplexer output signal, wherein the Y decoded signals determine which one of the multiplexer input signals to provide as the multiplexer output signal.

* * * * *

UNITED STATES PATENT AND TRADEMARK OFFICE
CERTIFICATE OF CORRECTION

PATENT NO.         : 7,378,879 B1                                    Page 1 of 1
APPLICATION NO. : 11/157349
DATED              : May 27, 2008
INVENTOR(S)        : Luis De La Cruz It is certified that error appears in the above-identified patent and that said Letters Patent is hereby corrected as shown below:

Col. 8 line 16/17 (claim 1): change "(e.g., D', EF', and F')" to

--(e.g., D', E', and F')--

Signed and Sealed this

Seventh Day of July, 2009

JOHN DOLL
*Acting Director of the United States Patent and Trademark Office*